United States Patent
Luo et al.

(10) Patent No.: US 9,669,726 B2
(45) Date of Patent: Jun. 6, 2017

(54) BATTERY CONTROL DEVICE, POWER STORAGE DEVICE, POWER STORAGE METHOD, AND PROGRAM

(71) Applicant: NEC Corporation, Tokyo (JP)

(72) Inventors: Yuan Luo, Tokyo (JP); Nobuhide Yoshida, Tokyo (JP); Junji Kogure, Tokyo (JP); Shinya Ohhata, Tokyo (JP); Shingo Takahashi, Tokyo (JP); Noriyuki Itabashi, Tokyo (JP)

(73) Assignee: NEC Corporation, Tokyo (JP)

( * ) Notice: Subject to any disclaimer, the term of this patent is extended or adjusted under 35 U.S.C. 154(b) by 209 days.

(21) Appl. No.: 14/441,922

(22) PCT Filed: Nov. 1, 2013

(86) PCT No.: PCT/JP2013/079691
§ 371 (c)(1),
(2) Date: May 11, 2015

(87) PCT Pub. No.: WO2014/073477
PCT Pub. Date: May 15, 2014

(65) Prior Publication Data
US 2015/0291050 A1     Oct. 15, 2015

(30) Foreign Application Priority Data
Nov. 12, 2012   (JP) .................. 2012-248354

(51) Int. Cl.
*H02J 7/00* (2006.01)
*B60L 11/18* (2006.01)
(Continued)

(52) U.S. Cl.
CPC ........ *B60L 11/1861* (2013.01); *G01R 31/362* (2013.01); *H01M 10/42* (2013.01);
(Continued)

(58) Field of Classification Search
CPC .. B60L 11/1861; G01R 31/362; H01M 10/42; H01M 10/44; H01M 10/48; H01M 2220/20; H02J 7/0052; H02J 7/0075; H02J 7/041
See application file for complete search history.

(56) References Cited

U.S. PATENT DOCUMENTS 5,631,533 A     5/1997 Imaseki
2010/0156351 A1  6/2010 Ugaji et al.
(Continued)

FOREIGN PATENT DOCUMENTS

JP     9-120843    5/1997
JP     3161215     4/2001
(Continued)

OTHER PUBLICATIONS

International Search Report mailed Feb. 4, 2014 in corresponding PCT International Application.

*Primary Examiner* — Vuthe Siek
(74) *Attorney, Agent, or Firm* — Finnegan, Henderson, Farabow, Garrett & Dunner, L.L.P.

(57) ABSTRACT

A battery control device (100) includes: a measurement unit (110) that measures a voltage of a secondary battery; a control unit (120) that initiates a charging process of performing charging until the voltage of the secondary battery reaches a second reference value greater than a first reference value in a case where a voltage measured by the measurement unit (110) is less than the first reference value; and an adjustment unit (130) that receives a degree of deterioration of the secondary battery as first adjustment information that becomes a reference for adjustment of a hysteresis width that is determined on the basis of the first reference value and the second reference value, and adjusts the hysteresis width on the basis of the first adjustment information that is received.

10 Claims, 18 Drawing Sheets

| STATUS OF SECONDARY BATTERY | | FIRST REFERENCE VALUE [V] | SECOND REFERENCE VALUE [V] |
|---|---|---|---|
| NEW PRODUCT | | 2.8 | 4.2 |
| DETERIORATION | SOH($\alpha$)>90% | 2.8 | 4.2 |
| | SOH($\alpha$)≤90% | $\beta = 2.8 + (1-\alpha)$ | 4.2 |

(51) Int. Cl.
  *H01M 10/44* (2006.01)
  *H01M 10/48* (2006.01)
  *H01M 10/42* (2006.01)
  *H02J 7/04* (2006.01)
  *G01R 31/36* (2006.01)

(52) U.S. Cl.
  CPC ........... *H01M 10/44* (2013.01); *H01M 10/48* (2013.01); *H02J 7/0052* (2013.01); *H02J 7/0075* (2013.01); *H02J 7/041* (2013.01); *H01M 2220/20* (2013.01)

(56) References Cited

U.S. PATENT DOCUMENTS

| | | |
|---|---|---|
| 2012/0223670 A1 | 9/2012 | Kinjo et al. |
| 2013/0063079 A1* | 3/2013 | Kawai ................... H02J 7/045 320/107 |
| 2013/0069598 A1 | 3/2013 | Tanaka et al. |
| 2013/0221907 A1 | 8/2013 | Suzuki et al. |

FOREIGN PATENT DOCUMENTS

| | | |
|---|---|---|
| JP | 2001-187676 | 7/2001 |
| JP | 2006-203978 | 8/2006 |
| JP | 2008-192607 | 8/2008 |
| JP | 2011-203259 | 10/2011 |
| JP | 2012-85443 | 4/2012 |
| JP | 2013-65481 | 4/2013 |
| WO | WO 2008/084791 A1 | 7/2008 |
| WO | WO 2012/032776 A1 | 3/2012 |
| WO | WO 2012/050062 A1 | 4/2012 |

* cited by examiner

FIG. 3

| STATUS OF SECONDARY BATTERY | | FIRST REFERENCE VALUE [V] | SECOND REFERENCE VALUE [V] |
|---|---|---|---|
| NEW PRODUCT | | 2.8 | 4.2 |
| DETE-RIORA-TION | SOH($\alpha$) > 90% | 2.8 | 4.2 |
| | SOH($\alpha$) ≦ 90% | $\beta = 2.8 + (1 - \alpha)$ | 4.2 |

| IDENTIFICATION INFORMATION | SOH |
|---|---|
| aaa | 100% |
| bbb | 50% |
| ccc | 80% |
| ⋮ | ⋮ |

| STATUS OF SECONDARY BATTERY | | FIRST REFERENCE VALUE [V] | SECOND REFERENCE VALUE [V] |
|---|---|---|---|
| NEW PRODUCT | | 2.8 | 4.2 |
| DETE-RIORA-TION | SOH($\alpha$)>90% | 2.8 | 4.2 |
| | SOH($\alpha$)≦90% | 2.8 | $\gamma = 4.2-(1-\alpha)$ |

(B)

| STATUS OF SECONDARY BATTERY | | FIRST REFERENCE VALUE [V] | SECOND REFERENCE VALUE [V] |
|---|---|---|---|
| NEW PRODUCT | | 2.8 | 4.2 |
| DETE-RIORA-TION | SOH($\alpha$)>90% | 2.8 | 4.2 |
| | SOH($\alpha$)≦90% | $\beta = 2.8+(1-\alpha)$ | $\gamma = 4.2-(1-\alpha)$ |

FIG. 10

| SEASON | | FIRST REFERENCE VALUE [ V ] | SECOND REFERENCE VALUE [ V ] |
|---|---|---|---|
| SPRING | MARCH TO MAY | 3.1 | 3.9 |
| SUMMER | JUNE TO AUGUST | 2.9 | 4.1 |
| AUTUMN | SEPTEMBER TO NOVEMBER | 3.0 | 4.0 |
| WINTER | DECEMBER TO FEBRUARY | 2.8 | 4.2 |

FIG. 11

| DAY OF WEEK | FIRST REFERENCE VALUE [V] | SECOND REFERENCE VALUE [V] |
|---|---|---|
| MONDAY TO FRIDAY | 3.1 | 3.9 |
| SATURDAY, SUNDAY, HOLIDAY | 2.8 | 4.2 |

FIG. 12

| TIME | FIRST REFERENCE VALUE [V] | SECOND REFERENCE VALUE [V] |
|---|---|---|
| 22:00〜7:00 | 3.1 | 3.9 |
| 7:00〜12:00 | 2.9 | 4.1 |
| 12:00〜18:00 | 2.8 | 4.2 |
| 18:00〜22:00 | 3.0 | 4.0 |

FIG. 13

| ATMOSPHERIC TEMPERATURE | FIRST REFERENCE VALUE [V] | SECOND REFERENCE VALUE [V] |
|---|---|---|
| ~10°C | 2.8 | 4.2 |
| 10°C~20°C | 3.1 | 3.9 |
| 20°C~30°C | 3.0 | 4.0 |
| 30°C~ | 2.8 | 4.2 |

FIG. 15

| DAY OF WEEK | TIME | FIRST REFERENCE VALUE [V] | SECOND REFERENCE VALUE [V] |
|---|---|---|---|
| MONDAY TO FRIDAY | 22:00~7:00 | 3.1 | 3.9 |
| | 7:00~12:00 | 3.0 | 4.0 |
| | 12:00~18:00 | 2.95 | 4.05 |
| | 18:00~22:00 | 3.05 | 3.95 |
| SATURDAY, SUNDAY, HOLIDAY | 22:00~7:00 | 2.95 | 4.05 |
| | 7:00~12:00 | 2.85 | 4.15 |
| | 12:00~18:00 | 2.8 | 4.2 |
| | 18:00~22:00 | 2.9 | 4.1 |

BATTERY CONTROL DEVICE, POWER STORAGE DEVICE, POWER STORAGE METHOD, AND PROGRAM

CROSS-REFERENCE TO RELATED PATENT APPLICATIONS

This application is a National Stage Entry of International Application No. PCT/JP2013/079691, filed Nov. 1, 2013, which claims priority from Japanese Patent Application No. 2012-248354, filed Nov. 12, 2012. The entire contents of the above-referenced applications are expressly incorporated herein by reference.

TECHNICAL FIELD

The present invention relates to a battery control device that controls a secondary battery, a power storage device, a power storage method, and a program.

BACKGROUND ART

Recently, a secondary battery such as a lithium ion battery has been used in various fields so as to reduce environmental load. Deterioration of the secondary battery progresses while in use. To reduce the running cost of the secondary battery, it is necessary to suppress the progress of the deterioration.

Patent Document 1 and Patent Document 2 disclose an example of a charging method capable of suppressing deterioration of a secondary battery. In a method disclosed in Patent Document 1, when a voltage of a secondary battery, which is measured during charging, reaches a fully charged voltage, charging of the secondary battery is stopped, and when a voltage of the secondary battery, which is measured during discharging, is less than a constant voltage, charging of the secondary battery is restarted. In addition, Patent Document 2 discloses an example of a charging method of securing sufficient electric power so as to operate a device in consideration of a variation in demand for electric power. In Patent Document 2, a method of suppressing deterioration of the secondary battery is disclosed. In the method, a power storage device is charged in accordance with a charging target value for every hour which is set in advance in accordance with demand for electric power so as to avoid frequent charging in the vicinity of full charge.

RELATED DOCUMENT

Patent Document

[Patent Document 1] Japanese Unexamined Patent Publication No. 2006-203978
[Patent Document 2] Japanese Unexamined Patent Publication No. 2001-187676

DISCLOSURE OF THE INVENTION

In general, when the secondary battery is retained in a state close to full charge or over-discharge, deterioration of the secondary battery tends to progress. In addition, a battery capacity (full charge capacity) of a deteriorated secondary battery at full charge is smaller than a full charge capacity of a new secondary battery. According to this, the deteriorated secondary battery tends to be close to a fully charged state or an over-discharged state in comparison to a new secondary battery. Accordingly, the present inventors have conceived that deterioration of the secondary battery can be effectively suppressed by controlling the state of the secondary battery to avoid the fully charged state or the over-discharged state in accordance with the degree of deterioration of the secondary battery.

An object of the invention is to provide a battery control device, a power storage device, a power storage method, and a program which are capable of effectively suppressing deterioration of a secondary battery.

According to an aspect of the invention, there is provided a battery control device including: a measurement unit that measures a voltage of a secondary battery; a control unit that initiates a charging process of performing charging until the voltage of the secondary battery reaches a second reference value greater than a first reference value in a case where a voltage measured by the measurement unit is less than the first reference value; and an adjustment unit that receives a degree of deterioration of the secondary battery as first adjustment information that becomes a reference for adjustment of a hysteresis width that is determined on the basis of the first reference value and the second reference value, and adjusts the hysteresis width on the basis of the first adjustment information that is received.

According to another aspect of the invention, there is provided a power storage device including: a secondary battery; a measurement unit that measures a voltage of a secondary battery; a control unit that initiates a charging process of performing charging until the voltage of the secondary battery reaches a second reference value greater than a first reference value in a case where a voltage measured by the measurement unit is less than the first reference value; and an adjustment unit that receives a degree of deterioration of the secondary battery as adjustment information for adjustment of a hysteresis width that is determined on the basis of the first reference value and the second reference value, and adjusts the hysteresis width on the basis of the adjustment information that is received.

According to still another aspect of the invention, there is provided a power storage method including allowing a computer to: measure a voltage of a secondary battery; initiate a charging process of performing charging until the voltage of the secondary battery reaches a second reference value greater than a first reference value in a case where a voltage that is measured is less than the first reference value; and receive a degree of deterioration of the secondary battery as adjustment information for adjustment of a hysteresis width that is determined on the basis of the first reference value and the second reference value, and adjust the hysteresis width on the basis of the adjustment information that is received.

According to still another aspect of the invention, there is provided a program that allows a computer to function as a measurement unit that measures a voltage of a secondary battery; a control unit that initiates a charging process of performing charging until the voltage of the secondary battery reaches a second reference value greater than a first reference value in a case where a voltage measured by the measurement unit is less than the first reference value; and an adjustment unit that receives a degree of deterioration of the secondary battery as adjustment information for adjustment of a hysteresis width that is determined on the basis of the first reference value and the second reference value, and adjusts the hysteresis width on the basis of the adjustment information that is received.

According to the invention, it is possible to effectively suppress deterioration of a secondary battery.

BRIEF DESCRIPTION OF THE DRAWINGS

The above and other objects, advantages and features of the present invention will be more apparent from the following description of certain preferred exemplary embodiments taken in conjunction with the accompanying drawings.

FIG. 3 is a view illustrating an example of a first adjustment table.

FIG. 5 is a view illustrating an example of information that is stored in a first storage unit.

FIG. 8 is a view illustrating a modification example of the first adjustment table.

FIG. 10 is a view illustrating an example of a second adjustment table that is set on the basis of a season.

FIG. 11 is a view illustrating an example of the second adjustment table that is set on the basis of a day of the week.

FIG. 12 is a view illustrating an example of the second adjustment table that is set on the basis of time.

FIG. 13 is a view illustrating an example of the second adjustment table that is set on the basis of a temperature.

FIG. 15 is a view illustrating an example of the second adjustment table that is set on the basis of a plurality of criteria.

DESCRIPTION OF EXEMPLARY EMBODIMENTS

Figure 1:
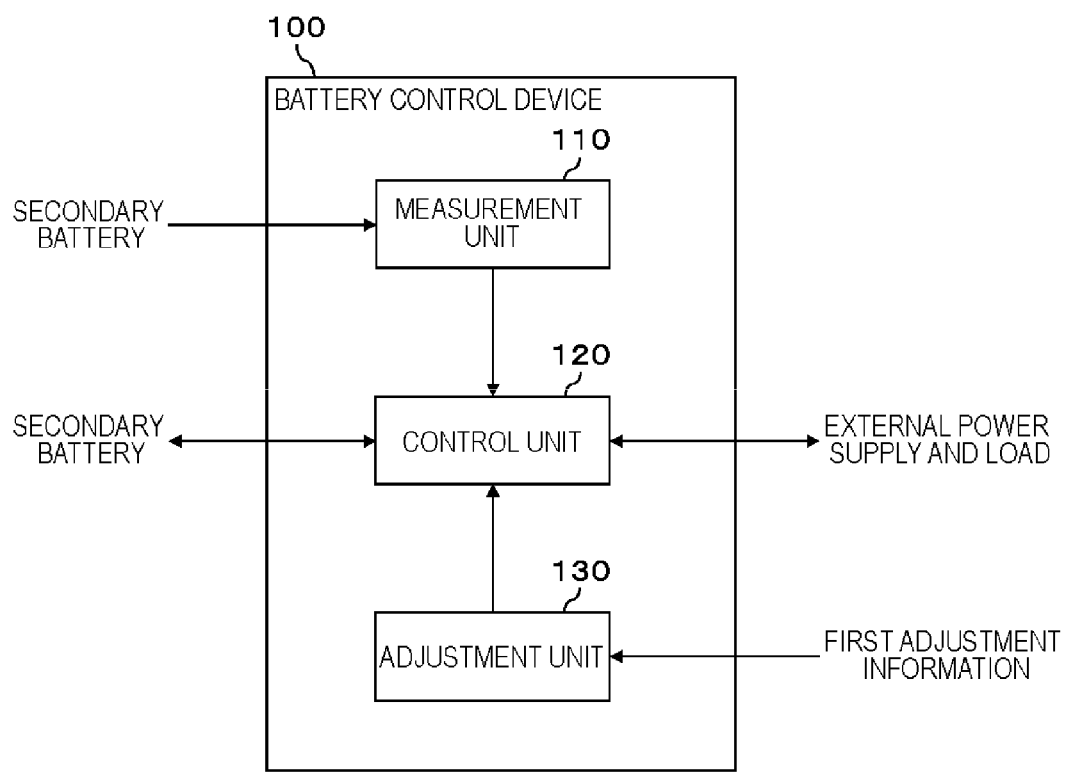
FIG. 1 is a view illustrating a configuration example of a battery control device according to a first exemplary embodiment.

Hereinafter, exemplary embodiments of the invention will be described with reference to the accompanying drawings. Like reference numerals will be given to like constituent elements having substantially the same functions, and description thereof will not be repeated.

In addition, in the following description, respective processing units of a battery control device 100 indicate a block in a function unit instead of a configuration in a hardware unit. The respective processing units of the battery control device 100 are realized by a CPU, a memory, a program loaded to the memory to realize component elements of the accompanying drawings, a storage medium such as a hard disk that stores the program, and an arbitrary combination of hardware and software with a focus on a network connection interface in an arbitrary computer. In addition, a method and a device for realization thereof include various modification examples.

First Exemplary Embodiment

FIG. 1 is a view illustrating a configuration example of a battery control device 100 according to a first exemplary embodiment. The battery control device 100 is a device that controls charging of a secondary battery provided to a power storage device (not illustrated). In an example illustrated in the drawing, the battery control device 100 includes a measurement unit 110, a control unit 120, and an adjustment unit 130.

The measurement unit 110 is connected to at least one or more secondary batteries (not illustrated), and measures a voltage of each of the secondary batteries.

The control unit 120 controls charging of the secondary battery on the basis of a voltage that is measured by the measurement unit 110. Specifically, in a case where the voltage of the second battery which is measured by the measurement unit 110 is less than a first reference value, the control unit 120 initiates a charging process of performing charging until the voltage of the secondary battery reaches a second reference value. Here, the first reference value represents a voltage value which is set in advance and becomes an index for initiation of the charging of the secondary battery. In addition, the second reference value represents a voltage value which is set in advance and becomes an index for stopping of the charging of the secondary battery. Here, for example, the first reference value and the second reference value may be set in advance in the control unit 120 in correlation with identification information that identifies a secondary battery. In addition, the first reference value and the second reference value may be stored in a storage unit (not illustrated) such as a memory and a storage in correlation with the identification information that identifies the secondary battery. In this case, the control unit 120 reads out the first reference value and the second reference value for each secondary battery 210 from the storage unit, and executes a charging process.

In addition, the control unit 120 connects the secondary battery to an external power supply (for example, a centralized power supply) and a load. In addition, for example, the control unit 120 includes an alternating current (AC)-direct current (DC) converting unit (not illustrated). For example, during charging of the secondary battery, the control unit 120 converts power from the centralized power supply to DC power by using the AC-DC converting unit. In addition, during discharging of the secondary battery, the control unit 120 converts power from the secondary battery to AC power by using the AC-DC converting unit.

The adjustment unit 130 receives a degree of deterioration of the secondary battery as first adjustment information that becomes a reference for adjustment of a hysteresis width, and adjusts the hysteresis width in accordance with the degree of deterioration. Here, the adjustment unit 130 may read out the first adjustment information from a storage unit (a memory, a storage, and the like) that is embedded in the battery control device 100, or may receive the first adjustment information from outside the battery control device 100. In addition, the hysteresis width represents a width of a voltage which is expressed by a section that is equal to or greater than the first reference value and is equal to or less than the second reference value. In addition, the degree of deterioration that is received as the first adjustment information is, for example, a state of health (SOH). For example, the SOH can be calculated by the following Equation 1. Here, for example, the battery capacity of the secondary battery can be calculated by integrating a current that is applied to the secondary battery during charging on the basis of a charging time.

[Mathematical Formula 1]

$$SOH[\%] = \frac{\text{FULL CHARGE CAPACITY DURING DETERIORATION[Ah]}}{\text{INITIAL FULL CHARGE CAPACITY[Ah]}} \times 100[\%] \quad \text{(EQUATION 1)}$$

Figure 2:
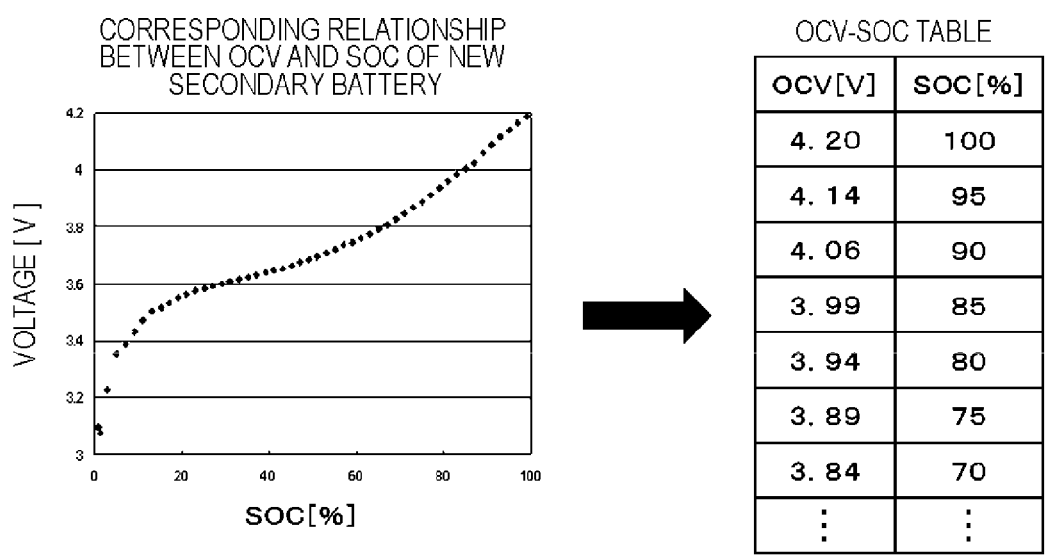
FIG. 2 is a view illustrating an example of OCV-SOC table that is set on the basis of a measured value.

In addition, the SOH of the secondary battery can also be calculated on the basis of a corresponding relationship between an initial open circuit voltage (OCV) and a state of charge (SOC) of the secondary battery. For example, the relationship between the initial OCV and SOC of the secondary battery is set in the battery control device 100 or other devices in a table format (OCV-SOC table). A value that is stored in the OCV-SOC table may be a measured value that is obtained by sequentially measuring an integrated value of a voltage and a charging current when charging a new secondary battery for the first time. FIG. 2 is a view illustrating an example of the OCV-SOC table that is set on the basis of the measured value. In addition, a value that is stored in the OCV-SOC table may be a value obtained from product specifications such as a data sheet. In addition, the degree of deterioration of the secondary battery in comparison to an initial state is obtained with reference to the OCV-SOC table by using the OCV in a fully charged state of the secondary battery. For example, it is assumed that the OCV of an arbitrary secondary battery in the fully charged state was 3.99 [V]. In this case, when referencing the OCV-SOC table as illustrated in FIG. 2, it is possible to determine that the SOC of a current secondary battery at full charge corresponds to 85 [%] of the SOC of a new secondary battery at full charge. That is, the SOH of the secondary battery can be calculated as 85 [%]. In addition, in the case of calculating the SOH as described above, it is preferable to measure the OCV of the secondary battery after passage of a certain extent of time (for example, after two hours, and the like) after the secondary battery becomes fully charged. The reason for this is as follows. After passage of a certain extent of time, a state of the secondary battery becomes stable, and thus it is possible to calculate the SOH with accuracy.

In addition, the adjustment unit 130 adjusts the hysteresis width on the basis of the SOH of the secondary battery and a first adjustment table. Here, for example, the first adjustment table is set in advance in the adjustment unit 130. In addition, information for adjustment of the hysteresis width on the basis of the SOH is set in the first adjustment table. It is preferable that the information is set in the first adjustment table in such a manner that the hysteresis width of the secondary battery decreases in accordance with processing of the deterioration in the secondary battery.

FIG. 3 is a view illustrating an example of the first adjustment table. In an example illustrated in FIG. 3, the adjustment unit 130 adjusts the hysteresis width of the secondary battery by changing the first reference value of the secondary battery on the basis of the SOH. Specifically, the adjustment unit 130 determines whether or not the deteriorated SOH of the secondary battery is equal to or less than a reference value. In addition, FIG. 3 illustrates a case where the reference value is 90%. In addition, in a case where the SOH of the secondary battery is equal to or less than 90%, the adjustment unit 130 changes the first reference value on the basis of the SOH and information that is set in the first adjustment table. On the other hand, in a case where the SOH of the secondary battery exceeds 90%, the adjustment unit 130 does not change the first reference value. In addition, in the example illustrated in FIG. 3, the adjustment unit 130 does not change a second reference value of the secondary battery regardless of the SOH of the secondary battery. In addition, information that is set in the first adjustment table is not limited to FIG. 3. The information of the first adjustment table may be set by a user in an arbitrary manner. In addition, the first adjustment table may be provided to a processing unit other than the adjustment unit 130, or other devices which are located outside the battery control device 100.

Figure 4:
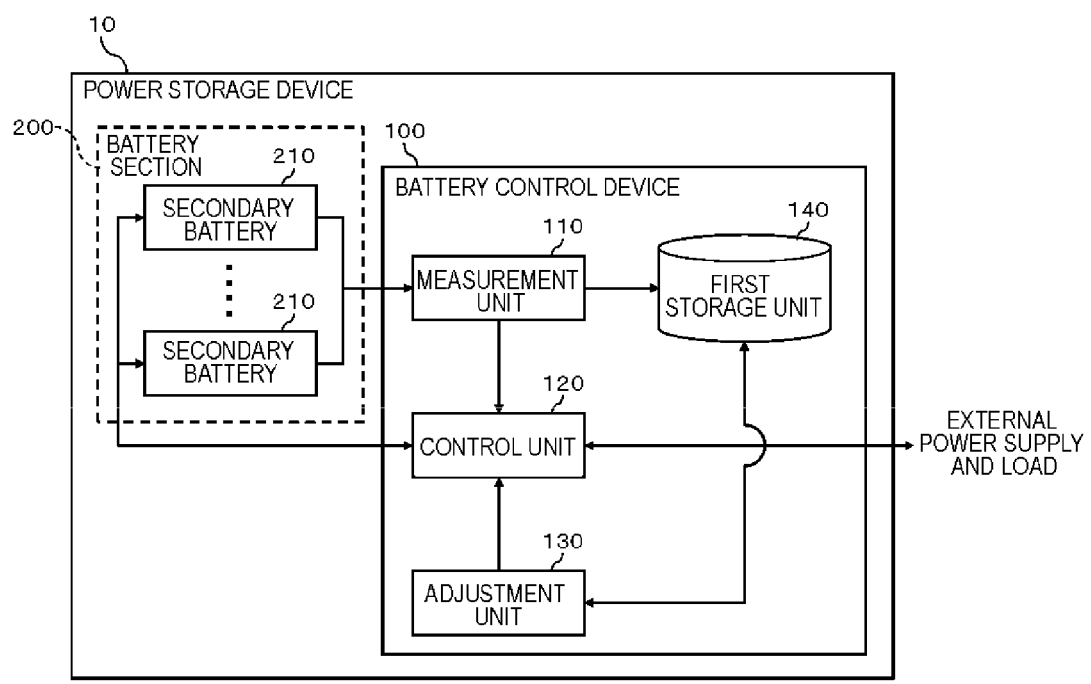
FIG. 4 is a view illustrating a detailed configuration example of a power storage device according to the first exemplary embodiment.

FIG. 4 is a view illustrating a detailed configuration example of a power storage device 10 according to the first exemplary embodiment. The power storage device 10 includes the battery control device 100 and a battery section 200.

The battery section 200 includes at least one or more secondary batteries 210. The secondary batteries 210 are connected to the measurement unit 110 and the control unit 120. Here, for example, the secondary batteries 210 are lithium ion secondary batteries. The secondary batteries 210 may be obtained by connecting a plurality of secondary battery packages in series. Each of the second battery packages may be obtained by connecting a plurality of secondary battery cells in parallel.

In addition, in FIG. 4, the battery control device 100 further includes a first storage unit 140. The first storage unit 140 stores the SOH indicating a deterioration state for each of the secondary batteries 210. In addition, FIG. 5 is a view illustrating an example of information that is stored in the first storage unit 140. In FIG. 5, information, which is configured to individually identify each of the secondary batteries 210 included in the battery section 200, is stored in a column of identification information. Examples of the identification information include a serial number of each of the secondary batteries 210 and the like. In addition, the SOH of the secondary battery 210 is stored in a column of the SOH. As described above, the SOH is calculated on the basis of Equation 1 or the SOC-OCV table when charging of the secondary battery 210 is completed, and is stored in the first storage unit 140. In addition, the adjustment unit 130 reads out the SOH corresponding to the secondary battery 210 as a target from the first storage unit 140, and adjusts the hysteresis width of the secondary battery 210. In an example in FIG. 4, the SOH is calculated on the basis of a voltage of the secondary battery 210 which is measured by the measurement unit 110, and is stored in the first storage unit 140. In addition, the SOH may be calculated by other processing units (not illustrated) without limitation thereto, and may be stored in the first storage unit 140. In addition, the first storage unit 140 may be provided to other devices which are located outside the battery control device 100.

Figure 6:
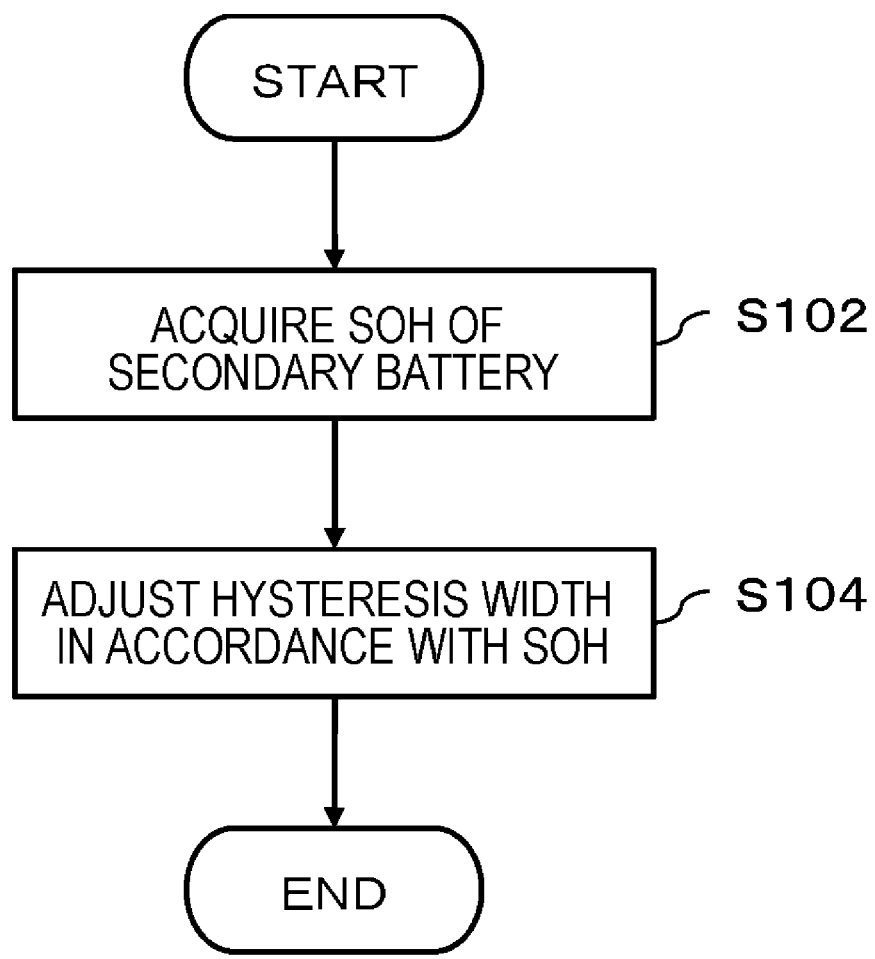
FIG. 6 is a flowchart illustrating a flow of adjusting a hysteresis width by a battery control device according to the first exemplary embodiment.
Figure 7:
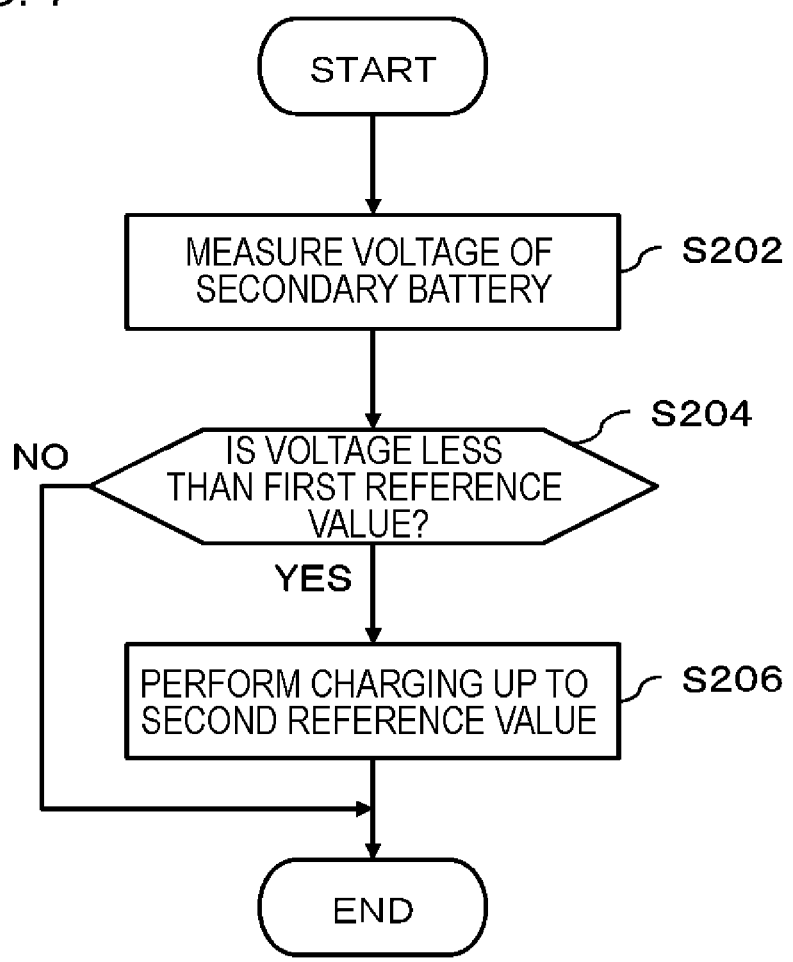
FIG. 7 is a flowchart illustrating a flow of a charging process executed by the battery control device according to the first exemplary embodiment.

A process flow of the battery control device 100 according to this exemplary embodiment will be described with reference to FIGS. 6 and 7. FIG. 6 is a flowchart illustrating a flow of adjusting the hysteresis width by the battery control device 100 according to the first exemplary embodiment. In addition, FIG. 7 is a flowchart illustrating a flow of a charging process that is executed by the battery control device 100 according to the first exemplary embodiment.

First, a flow of adjusting the hysteresis width by the battery control device 100 will be described. For example, this process is executed after the SOH of the secondary battery 210, which is calculated when charging of the secondary battery 210 is completed, is stored in the first storage unit 140. In addition, this process may be executed at each time that is determined in advance, or at predetermined intervals.

The battery control device 100 acquires the degree of deterioration (SOH) of the secondary battery (S102). In this exemplary embodiment, the battery control device 100 acquires the SOH corresponding to the secondary battery 210 from the first storage unit 140 by using identification information of the secondary battery. In addition, the battery control device 100 adjusts the hysteresis width in accordance with the SOH that is acquired in S102 (S104). For example, it is assumed that the first adjustment table as illustrated in FIG. 3 was set. In this case, when the SOH that is acquired in S102 is equal to or less than 90%, the first reference value is changed in accordance with the SOH. According to this, the hysteresis width is adjusted.

Next, a flow of a charging process that is executed by the battery control device 100 will be described. Here, the battery section 200 includes a plurality of the secondary batteries 210, the charging process is executed with respect to each of the secondary batteries 210.

The battery control device 100 measures a voltage of the secondary battery 210 by using the measurement unit 110 (S202). In addition, the battery control device 100 determines whether or not the voltage of the secondary battery 210, which is measured in S202, is less than the first reference value of the secondary battery 210 (S204). In a case where the voltage of the secondary battery 210 is less than the first reference value (YES in S204), the battery control device 100 charges the secondary battery 210 until the voltage of the secondary battery 210 reaches the second reference value (S206). On the other hand, in a case where the voltage of the secondary battery 210 is not less than the first reference value (NO in S204), the battery control device 100 terminates the process.

As described above, in this exemplary embodiment, the hysteresis width of the secondary battery is adjusted by changing the first reference voltage in accordance with the SOH of the secondary battery. In addition, the charging process is executed in accordance with the hysteresis width that is adjusted. As described above, according to this exemplary embodiment, the hysteresis width is adjusted in order to avoid an over-discharged state of the secondary battery in accordance with the degree of deterioration of the secondary battery, and thus it is possible to suppress deterioration of the secondary battery.

In addition, in this exemplary embodiment, the first adjustment table is not limited to FIG. 3. For example, the first adjustment table may be a table as illustrated in FIG. 8. FIG. 8 is a view illustrating a modification example of the first adjustment table. In a first adjustment table illustrated in FIG. 8(A), the hysteresis width is adjusted by changing only the second reference value. In this case, in S104, the second reference value is changed in accordance with the SOH. In addition, in S206, the second reference value that is changed is used. In this configuration, the hysteresis width is adjusted in order to avoid a fully charged state of the secondary battery, and thus it is possible to suppress deterioration of the secondary battery similar to the case of changing only the first reference value.

In addition, in a first adjustment table illustrated in FIG. 8(B), the hysteresis width is adjusted by changing the first reference value and the second reference value. In this case, in S104, the battery control device 100 changes the first reference value and the second reference value in accordance with the SOH. In this case, in S104, the first reference value and the second reference value are changed. In addition, in S204, the first reference value that is changed is used, and in S206, the second reference value that is changed is used. According to this configuration, the hysteresis width is adjusted in order to avoid both the fully charged state and the over-discharged state of the secondary battery, and thus it is possible to effectively suppress deterioration of the secondary battery in comparison to the case of changing only the first reference value or the second reference value.

Second Exemplary Embodiment

A second exemplary embodiment is substantially the same as the first exemplary embodiment except for the following configuration.

Demand for electric power may vary in accordance with factors such as a season, a day of the week, time, and an atmospheric temperature. It is preferable to secure electric power satisfying the demand while suppressing deterioration of the secondary battery from the viewpoint of effective use of the secondary battery. Accordingly, a battery control device 100 of a second exemplary embodiment adjusts the hysteresis width in consideration of an effect of the factors on the demand for electric power as described above.

Figure 9:
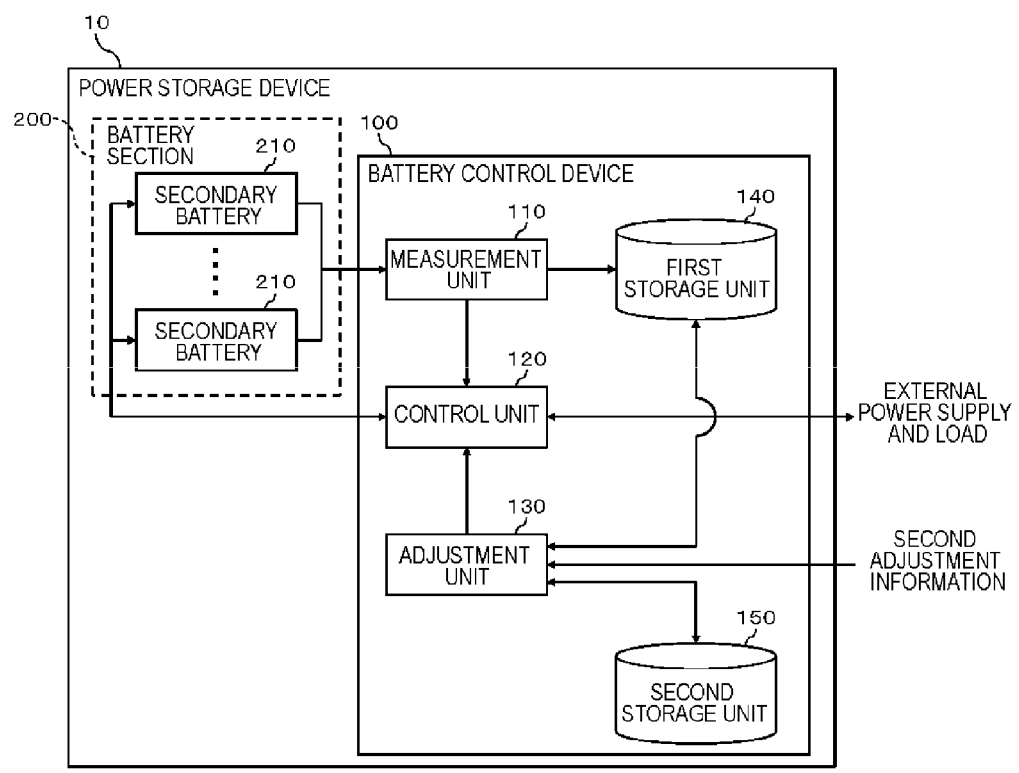
FIG. 9 is a view illustrating a detailed configuration example of a power storage device according to a second exemplary embodiment.

FIG. 9 is a view illustrating a detailed configuration example of a power storage device 10 according to the second exemplary embodiment. In FIG. 9, the battery control device 100 further includes a second storage unit 150. The second storage unit 150 stores a second adjustment table. Information for adjustment of the hysteresis width according to second adjustment information is set in the second adjustment table. Here, the second adjustment information represents any one of a season, a day of the week, time, and an atmospheric temperature. In addition, a first reference value and a second reference value, which are based on at least several kinds of demand forecasting among a season, a day of the week, time, and an atmospheric temperature, are set in the second adjustment table. FIGS. 10 to 13 are views illustrating an example of the second adjustment table that is stored in the second storage unit 150. In addition, the second storage unit 150 may be provided to other devices which are located outside the battery control device 100.

FIG. 10 is a view illustrating an example of the second adjustment table that is set on the basis of a season. In FIG. 10, seasons are classified into spring, summer, autumn, and winter. The classification of the four seasons is as follows. March to May are classified as spring, June to August are classified as summer, September to November are classified as autumn, and December to February are classified as winter. In addition, for example, values, which are determined by statistically analyzing demand for electric power in the past on the basis of the season, are set to each of the first reference value and the second reference value. In addition, in FIG. 10, March to May are classified as spring, June to August are classified as summer, September to November are classified as autumn, and December to February are classified as winter, but classification of the seasons is not limited thereto. In addition, values of the first reference value and the second reference value which are illustrated in FIG. 10 are illustrative only, and there is no limitation thereto. The classification of the seasons, and the first and second reference values can be set by a user in an arbitrary manner.

FIG. 11 is a view illustrating an example of the second adjustment table that is set on the basis of a day of the week. In FIG. 11, a day of the week is classified into a weekday and a holiday. In addition, for example, values, which are determined by statistically analyzing demand for electric power in the past on the basis of a day of the week, are set to each of the first reference value and the second reference value. In FIG. 11, a day of the week is classified into a weekday and a holiday, but there is no limitation thereto. For example, Monday to Sunday are individually classified, and the first reference value and the second reference value may be set with respect to respective days of the week. In addition, values of the first reference value and the second reference value illustrated in FIG. 11 are illustrative only, and there is no limitation thereto. The first reference value and the second reference value which are set in accordance with a day of the week may be set by a user in an arbitrary manner.

FIG. 12 is a view illustrating an example of the second adjustment table that is set on the basis of time. In FIG. 12, time is classified into 22:00 to 7:00, 7:00 to 12:00, 12:00 to 18:00, and 18:00 to 22:00. In addition, for example, values, which are determined by statistically analyzing demand for electric power in the past on the basis of time, are set to each of the first reference value and the second reference value. In addition, the time classification method is not limited thereto. In addition, values of the first reference value and the second reference value which are illustrated in FIG. 12 are illustrative only, and there is no limitation thereto. The time classification method and the values of the first reference value and the second reference value can be set by a user in an arbitrary manner.

FIG. 13 is a view illustrating an example of the second adjustment table that is set on the basis of an atmospheric temperature. In FIG. 13, the atmospheric temperature is classified into lower than 10° C., 10° C. to 20° C., 20° C. to 30° C., and equal to or higher than 30° C. In addition, for example, values, which are determined by statistically analyzing demand for electric power in the past on the basis of the atmospheric temperature, are set to each of the first reference value and the second reference value. In addition, the atmosphere temperature classification method is not limited thereto. In addition, the values of the first reference value and the second reference value which are illustrated in FIG. 13 are illustrative only, and there is no limitation thereto. The atmospheric temperature classification method, and the values of the first reference value and the second reference value can be set by a user in an arbitrary manner.

The adjustment unit 130 of this exemplary embodiment adjusts the hysteresis width on the basis of second adjustment information that is acquired in addition to the SOH (first adjustment information). In this case, for example, the adjustment unit 130 executes the following process in addition to the process of the first exemplary embodiment. The adjustment unit 130 further acquires the second adjustment information such as a day of the week and time. In addition, the adjustment unit 130 acquires the first reference value and the second reference value with reference to the second adjustment table stored in the second storage unit 150 by using the acquired second adjustment information. In addition, the adjustment unit 130 adjusts the hysteresis width on the basis of the first reference value and the second reference value which are acquired by using the first adjustment information, and the values which are acquired by using the second adjustment information. For example, the adjustment unit 130 adjusts the hysteresis width on the basis of an average value or an intermediate value of the first reference value and the second reference value which are acquired by using the first adjustment information, and the first reference value and the second reference value which are acquired by using the second adjustment information, and the like.

Figure 14:
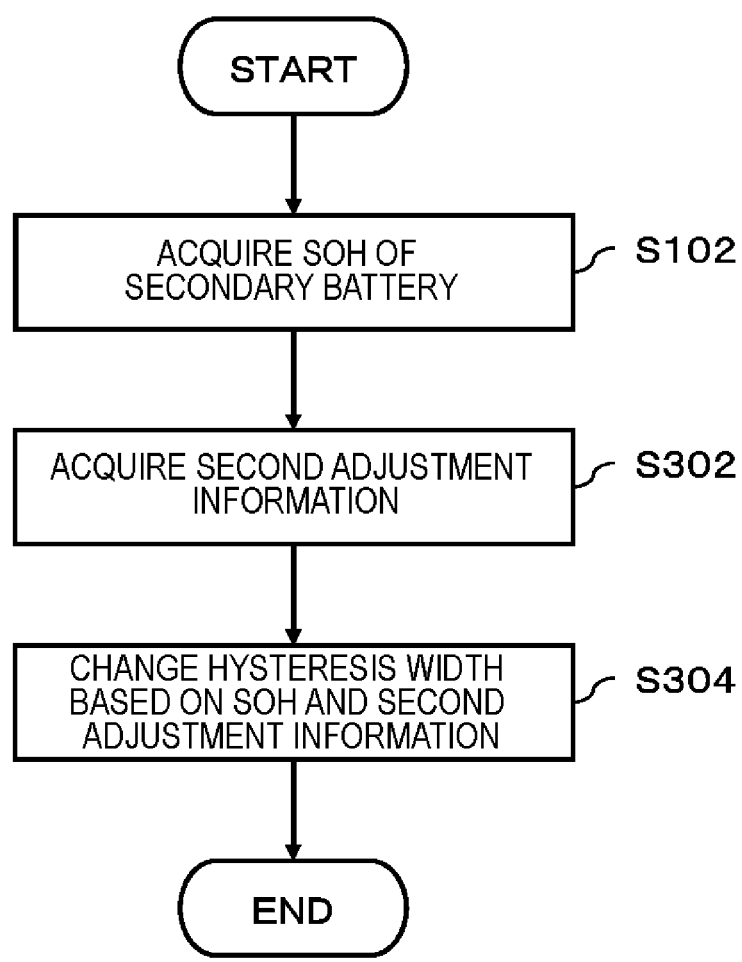
FIG. 14 is a flowchart illustrating a process flow of a battery control device according to the second exemplary embodiment.

A process flow of the battery control device 100 according to this exemplary embodiment will be described with reference to FIG. 14. FIG. 14 is a flowchart illustrating a process flow of the battery control device 100 according to the second exemplary embodiment. In addition, for example, the process may be executed in conjunction with the process of changing the hysteresis width on the basis of the first adjustment information in the first exemplary embodiment. In addition, the process may be executed at each time that is determined in advance, or at predetermined intervals.

The battery control device 100 acquires the second adjustment information from the second storage unit 150 (S302). For example, the battery control device 100 can acquire a season, time, and a day of the week as the second adjustment information on the basis of a system time of the battery control device 100, and the like. In addition, for example, the battery control device 100 can acquire the atmospheric temperature as the second adjustment information by using a temperature sensor (not illustrated). In addition, the battery control device 100 adjusts the hysteresis width of the secondary battery on the basis of the SOH of the secondary battery 210 which is acquired in S102, and the second adjustment information that is acquired in S302 (S304). For example, it is assumed that the battery control device 100 acquired the second adjustment information of "atmospheric temperature of 15° C." by using the temperature sensor (not illustrated). In this case, the adjustment unit 130 acquires "3.1 V" and "3.9 V" as the first reference value and the second reference value from the second adjustment table as illustrated in FIG. 13, respectively. Here, it is assumed that the SOH of the secondary battery 210 that is a processing target is 80%, and the first adjustment table illustrated in FIG. 8(B) was set. In this case, in S102, the battery control device 100 acquires the first reference value of "3.0 V" and the second reference value of "4.0 V" on the basis of the SOH. In addition, for example, the battery control device 100 calculates an average value of the first reference value and an average value of the second reference value, respectively. Here, "3.05 V" is calculated as the average value of the first reference value, and "3.95 V" is calculated as the average value of the second reference value. According to this, the battery control device 100 can adjust the hysteresis width of the secondary battery 210 on the basis of the degree of deterioration of the battery and the demand forecasting. In addition, the battery control device 100 may calculate the average value, the intermediate value, and the like by further taking the first and second reference values acquired on the basis of a day of the week, time, and the like into consideration in addition to the atmospheric temperature, and may adjust the hysteresis width.

As described above, in this exemplary embodiment, the hysteresis width is adjusted on the basis of the first adjustment information and the second adjustment information.

That is, the hysteresis width is adjusted by further taking into consideration demand for electric power based on a day of the week, time, or the like. In view of the above, according to this exemplary embodiment, it is possible to stably secure an amount of electric power, which satisfies consumption, while suppressing deterioration of the secondary battery.

In addition, this exemplary embodiment illustrates an example of adjusting the hysteresis width by changing the first reference value and the second reference value on the basis of the second adjustment information. However, this exemplary embodiment is not limited thereto. For example, as described in the first exemplary embodiment, the hysteresis width may be adjusted by changing any one of the first reference value and the second reference value on the basis of the second adjustment information.

In addition, as illustrated in FIG. 15, the second storage unit 150 may store the first reference value and the second reference value, which are set on the basis of a plurality of references such as a day of the week and time, as the second adjustment information.

Third Exemplary Embodiment

Figure 16:
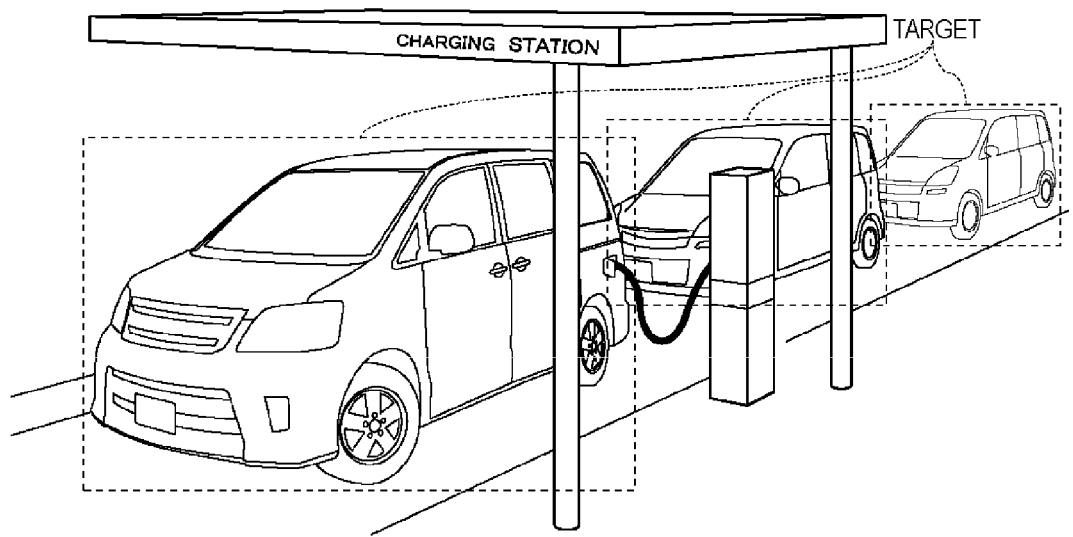
FIG. 16 is a view illustrating an example of image data that is acquired by a battery control device according to a third exemplary embodiment.

A battery control device 100 of a third exemplary embodiment is configured to appropriately secure a necessary amount of electric power in accordance with the number of targets which are extracted from image data. In this exemplary embodiment, description will be given to a case where the power storage device 10 is used in a charging station in which a battery of an electric vehicle (EV) or a plug-in hybrid vehicle (PHV) is charged as an example. FIG. 16 is a view illustrating an example of image data that is acquired by the battery control device 100 according to the third exemplary embodiment. In this exemplary embodiment, as illustrated by a portion indicated by dotted lines in FIG. 16, the EV or PHV that is a target is extracted from image data.

Figure 17:
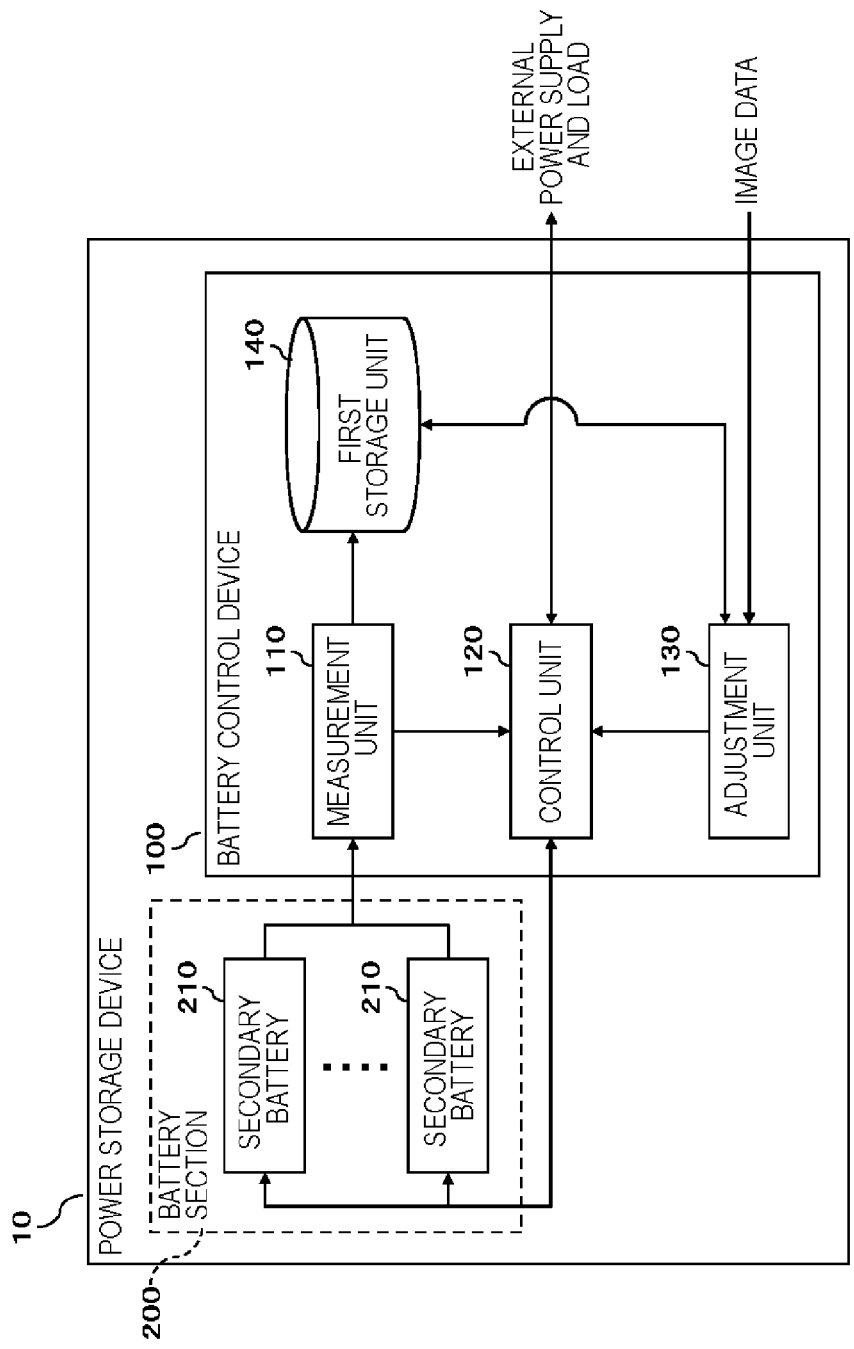
FIG. 17 is a view illustrating a detailed configuration example of a power storage device according to a third exemplary embodiment.

FIG. 17 is a view illustrating a detailed configuration example of the power storage device 10 according to the third exemplary embodiment. In this exemplary embodiment, in the battery control device 100, the adjustment unit 130 receives image data from an imaging unit (not shown) that captures an image, and extracts the EV and PHV which are targets from the image data. The adjustment unit 130 can extract the targets from the image data by using a typical image recognition process.

Figure 18:
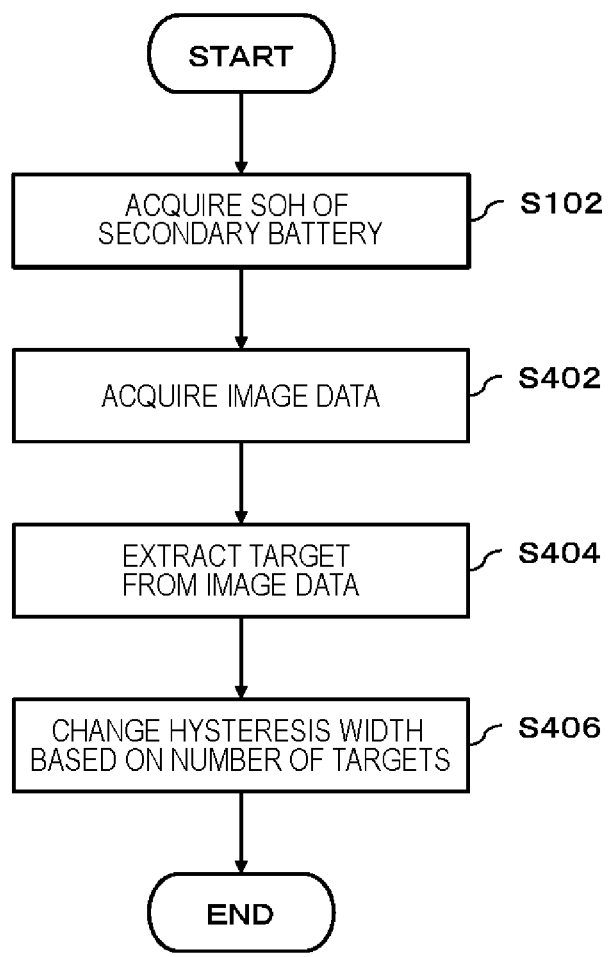
FIG. 18 is a flowchart illustrating a process flow of the battery control device according to the third exemplary embodiment.

A process flow of the battery control device 100 according to this exemplary embodiment will be described with reference to FIG. 18. FIG. 18 is a flowchart illustrating a process flow of the battery control device 100 according to the third exemplary embodiment. In addition, for example, the process may be executed in conjunction with the process of changing the hysteresis width on the basis of the first adjustment information in the first exemplary embodiment. In addition, the process may be executed at each time that is determined in advance, or at predetermined intervals.

For example, the battery control device 100 acquires image data that is captured by a fixed-point camera that is provided in a charging station, and the like (S402). The battery control device 100 extracts a target from the image data that is acquired in S402 (S404). For example, the battery control device 100 extracts the target through matching of a feature amount obtained from the image data by an edge detecting process and the like, and template data that becomes an index for determination as a vehicle. In addition, the battery control device 100 changes the hysteresis width of the secondary battery 210 on the basis of the SOH of the secondary battery 210 which is acquired in S102, and the number of targets which are extracted in S404 (S406). For example, the battery control device 100 raises the first reference value and the second reference value by a predetermined value (for example, 0.05 V) for each extracted target in a state in which the first reference value and the second reference value when the SOH 100% are set as the upper limits. According to this, the battery control device 100 can adjust the hysteresis width of the secondary battery 210 on the basis of the degree of deterioration of the battery and the demand forecasting.

As described above, in this exemplary embodiment, the hysteresis width is further adjusted on the basis of the number of targets such as the EVs and the PHVs which are recognized from the image data. As described above, according to this exemplary embodiment, the charging process of the secondary battery is controlled in accordance with the situation. Accordingly, it is possible to secure an amount of electric power, which satisfies consumption, in a further stable manner while suppressing deterioration of the secondary battery.

In addition, this exemplary embodiment illustrates an example in which the adjustment unit 130 of the battery control device 100 extracts targets from the image data, and acquires the number of the targets. However, the targets may be extracted from the image data by other devices which are located outside the battery control device 100, and the battery control device 100 may be configured to receive only the number of the extracted targets. Even in this configuration, the above-described effect is obtained.

In addition, in this exemplary embodiment, the battery control device 100 may adjust the hysteresis width on the basis of the number of targets which are extracted during a predetermined time range in the past. In this case, the battery control device 100 stores the extracted targets in a storage unit such as a memory and a storage in combination with time information indicating an extraction time. In addition, the storage unit may be embedded in the battery control device 100, or may be embedded in other devices which are located outside the battery control device 100. According to this configuration, the battery control device 100 can acquire the number of targets, which are extracted in a predetermined time, from the storage unit on the basis of the time information. In addition, the battery control device 100 can analyze a correlation between an increasing tendency of the targets and an increasing tendency of the demand, and the like from information stored in the storage unit. According to this, the battery control device 100 can predict the demand with accuracy from recent increasing tendency of the targets, and thus the battery control device 100 can select an appropriate hysteresis width.

Hereinbefore, the exemplary embodiments of the invention have been described with reference to the accompanying drawings, but the exemplary embodiments are illustrative only, and various configurations other than the above-described configuration can be employed.

For example, in the above-described exemplary embodiment, the SOH is used as an example of the degree of deterioration, but the degree of deterioration is not limited thereto. For example, an internal resistance value of the secondary battery may be set as the degree of deterioration.

In addition, in the plurality of flowcharts which are used in the description, a plurality of processes are sequentially described, but the execution sequence of the processes which are executed in the exemplary embodiment is not limited to the described sequence. In the exemplary embodiments, the sequence of the processes which are illustrated may be changed within a range not causing a problem in the contents thereof, for example, the processes may be executed in combination with each other. In addition, the exemplary embodiments can be combined with each other within a range in which the contents thereof are not contrary to each other.

In addition, according to the above-described exemplary embodiments, the following invention is disclosed.

(Additional Statement 1)

A battery control device, including:

a measurement unit that measures a voltage of a secondary battery;

a control unit that initiates a charging process of performing charging until the voltage of the secondary battery reaches a second reference value greater than a first reference value in a case where a voltage measured by the measurement unit is less than the first reference value; and an adjustment unit that receives a degree of deterioration of the secondary battery as first adjustment information that becomes a reference for adjustment of a hysteresis width that is determined on the basis of the first reference value and the second reference value, and adjusts the hysteresis width on the basis of the first adjustment information that is received.

(Additional Statement 2)

The battery control device according to Additional Statement 1, wherein the adjustment unit receives information indicating a state of health (SOH) as the degree of deterioration of the secondary battery.

(Additional Statement 3)

The battery control device according to Additional Statement 1 or 2, wherein the adjustment unit adjusts the hysteresis width by changing the first reference value.

(Additional Statement 4)

The battery control device according to Additional Statement 1 or 2, wherein the adjustment unit adjusts the hysteresis width by changing the second reference value.

(Additional Statement 5)

The battery control device according to Additional Statement 1 or 2, wherein the adjustment unit adjusts the hysteresis width by changing all of the first reference value and the second reference value.

(Additional Statement 6)

The battery control device according to any one of Additional Statements 1 to 5, wherein the adjustment unit receives any one of a season, a day of the week, time, and an atmospheric temperature as second adjustment information that becomes a reference for adjustment of the hysteresis width, and adjusts the hysteresis width on the basis of the second adjustment information that is received.

(Additional Statement 7)

The battery control device according to any one of Additional Statements 1 to 6, wherein the secondary battery is used in a charging station in which a battery of an electric vehicle (EV) or a plug-in hybrid vehicle (PHV) is charged, and the adjustment unit adjusts the hysteresis width on the basis of the number of the EVs or PHVs which are extracted from an image obtained by capturing the EVs or PHVs which enter the charging station.

(Additional Statement 8)

A power storage device, including:

a secondary battery;

a measurement unit that measures a voltage of a secondary battery;

a control unit that initiates a charging process of performing charging until the voltage of the secondary battery reaches a second reference value greater than a first reference value in a case where a voltage measured by the measurement unit is less than the first reference value; and an adjustment unit that receives a degree of deterioration of the secondary battery as adjustment information for adjustment of a hysteresis width that is determined on the basis of the first reference value and the second reference value, and adjusts the hysteresis width on the basis of the adjustment information that is received.

(Additional Statement 9)

A power storage method, including allowing a computer to:

measure a voltage of a secondary battery;

initiate a charging process of performing charging until the voltage of the secondary battery reaches a second reference value greater than a first reference value in a case where a voltage that is measured is less than the first reference value; and receive a degree of deterioration of the secondary battery as adjustment information for adjustment of a hysteresis width that is determined on the basis of the first reference value and the second reference value, and adjust the hysteresis width on the basis of the adjustment information that is received.

(Additional Statement 10)

A program that allows a computer to function as:

a measurement unit that measures a voltage of a secondary battery;

a control unit that initiates a charging process of performing charging until the voltage of the secondary battery reaches a second reference value greater than a first reference value in a case where a voltage measured by the measurement unit is less than the first reference value; and an adjustment unit that receives a degree of deterioration of the secondary battery as adjustment information for adjustment of a hysteresis width that is determined on the basis of the first reference value and the second reference value, and adjusts the hysteresis width on the basis of the adjustment information that is received.

(Additional Statement 11)

The power storage device according to Additional Statement 8, wherein the adjustment unit receives information indicating a state of health (SOH) as the degree of deterioration of the secondary battery.

(Additional Statement 12)

The power storage device according to Additional Statement 8 or 11, wherein the adjustment unit adjusts the hysteresis width by changing the first reference value.

(Additional Statement 13)

The power storage device according to Additional Statement 8 or 11, wherein the adjustment unit adjusts the hysteresis width by changing the second reference value.

(Additional Statement 14)

The power storage device according to Additional Statement 8 or 11, wherein the adjustment unit adjusts the hysteresis width by changing all of the first reference value and the second reference value.

(Additional Statement 15)

The power storage device according to any one of Additional Statements 8, and 11 to 14, wherein the adjustment unit receives any one of a season, a day of the week, time, and an atmospheric temperature as second adjustment information that becomes a reference for adjustment of the hysteresis width, and adjusts the hysteresis width on the basis of the second adjustment information that is received.

(Additional Statement 16)

The battery storage device according to any one of Additional Statement 8, and 11 to 15, wherein the secondary battery is used in a charging station in which a battery of an electric vehicle (EV) or a plug-in hybrid vehicle (PHV) is charged, and the adjustment unit adjusts the hysteresis width on the basis of the number of the EVs or PHVs which are extracted from an image obtained by capturing the EVs or PHVs which enter the charging station.

(Additional Statement 17)

The power storage method according to Additional Statement 9, wherein the computer receives information indicating a state of health (SOH) as the degree of deterioration of the secondary battery.

(Additional Statement 18)

The power storage method according to Additional Statement 9 or 17, wherein the computer adjusts the hysteresis width by changing the first reference value.

(Additional Statement 19)

The power storage method according to Additional Statement 9 or 17, wherein the computer adjusts the hysteresis width by changing the second reference value.

(Additional Statement 20)

The power storage method according to Additional Statement 9 or 17, wherein the computer adjusts the hysteresis width by changing all of the first reference value and the second reference value.

(Additional Statement 21)

The power storage method according to any one of Additional Statements 9, and 17 to 20, wherein the computer receives any one of a season, a day of the week, time, and an atmospheric temperature as second adjustment information that becomes a reference for adjustment of the hysteresis width, and adjusts the hysteresis width on the basis of the second adjustment information that is received.

(Additional Statement 22)

The power storage method according to any one of Additional Statements 9, and 17 to 21, wherein the secondary battery is used in a charging station in which a battery of an electric vehicle (EV) or a plug-in hybrid vehicle (PHV) is charged, and the computer adjusts the hysteresis width on the basis of the number of the EVs or PHVs which are extracted from an image obtained by capturing the EVs or PHVs which enter the charging station.

(Additional Statement 23)

The program according to Additional Statement 10, wherein the computer is allowed to function as a unit that receives information indicating a state of health (SOH) as the degree of deterioration of the secondary battery.

(Additional Statement 24)

The program according to Additional Statement 10 or 23, wherein the computer is allowed to function as a unit that adjusts the hysteresis width by changing the first reference value.

(Additional Statement 25)

The program according to Additional Statement 10 or 23, wherein the computer is allowed to function as a unit that adjusts the hysteresis width by changing the second reference value.

(Additional Statement 26)

The program according to Additional Statement 10 or 23, wherein the computer is allowed to function as a unit that adjusts the hysteresis width by changing all of the first reference value and the second reference value.

(Additional Statement 27)

The program according to any one of Additional Statements 10, and 23 to 26, wherein the computer is allowed to function as a unit that receives any one of a season, a day of the week, time, and an atmospheric temperature as second adjustment information that becomes a reference for adjustment of the hysteresis width, and adjusts the hysteresis width on the basis of the second adjustment information that is received.

(Additional Statement 28)

The program according to any one of Additional Statements 10, and 23 to 27, wherein the secondary battery is used in a charging station in which a battery of an electric vehicle (EV) or a plug-in hybrid vehicle (PHV) is charged, and the computer is allowed to function as a unit that adjusts the hysteresis width on the basis of the number of the EVs or PHVs which are extracted from an image obtained by capturing the EVs or PHVs which enter the charging station.

The present patent application claims priority from Japanese Patent Application No. 2012-248354 filed on Nov. 12, 2012, the disclosure of which is incorporated herein by reference.

The invention claimed is:

1. A battery control device, comprising:
   a measurement unit that measures a voltage of a secondary battery;
   a control unit that initiates a charging process of performing charging until the voltage of the secondary battery reaches a second reference value greater than a first reference value in a case where a voltage measured by the measurement unit is less than the first reference value; and
   an adjustment unit that receives a degree of deterioration of the secondary battery as first adjustment information that becomes a reference for adjustment of a hysteresis width that is determined on the basis of the first reference value and the second reference value, and adjusts the hysteresis width on the basis of the first adjustment information that is received.

2. The battery control device according to claim 1, wherein the adjustment unit receives information indicating a state of health (SOH) as the degree of deterioration of the secondary battery.

3. The battery control device according to claim 1, wherein the adjustment unit adjusts the hysteresis width by changing the first reference value.

4. The battery control device according to claim 1,
wherein the adjustment unit adjusts the hysteresis width by changing the second reference value.

5. The battery control device according to claim 1,
wherein the adjustment unit adjusts the hysteresis width by changing all of the first reference value and the second reference value.

6. The battery control device according to claim 1,
wherein the adjustment unit receives any one of a season, a day of the week, time, and an atmospheric temperature as second adjustment information that becomes a reference for adjustment of the hysteresis width, and adjusts the hysteresis width on the basis of the second adjustment information that is received.

7. The battery control device according to claim 1,
wherein the secondary battery is used in a charging station in which a battery of an electric vehicle (EV) or a plug-in hybrid vehicle (PHV) is charged, and
the adjustment unit adjusts the hysteresis width on the basis of the number of the EVs or PHVs which are extracted from an image obtained by capturing the EVs or PHVs which enter the charging station.

8. A power storage device, comprising:
a secondary battery;
a measurement unit that measures a voltage of a secondary battery;
a control unit that initiates a charging process of performing charging until the voltage of the secondary battery reaches a second reference value greater than a first reference value in a case where a voltage measured by the measurement unit is less than the first reference value; and
an adjustment unit that receives a degree of deterioration of the secondary battery as adjustment information for adjustment of a hysteresis width that is determined on the basis of the first reference value and the second reference value, and adjusts the hysteresis width on the basis of the adjustment information that is received.

9. A power storage method, comprising allowing a computer to:
measure a voltage of a secondary battery;
initiate a charging process of performing charging until the voltage of the secondary battery reaches a second reference value greater than a first reference value in a case where a voltage that is measured is less than the first reference value; and
receive a degree of deterioration of the secondary battery as adjustment information for adjustment of a hysteresis width that is determined on the basis of the first reference value and the second reference value, and adjust the hysteresis width on the basis of the adjustment information that is received.

10. A non-transitory computer readable medium storing a program, the program that allows a computer to function as:
a measurement unit that measures a voltage of a secondary battery;
a control unit that initiates a charging process of performing charging until the voltage of the secondary battery reaches a second reference value greater than a first reference value in a case where a voltage measured by the measurement unit is less than the first reference value; and
an adjustment unit that receives a degree of deterioration of the secondary battery as adjustment information for adjustment of a hysteresis width that is determined on the basis of the first reference value and the second reference value, and adjusts the hysteresis width on the basis of the adjustment information that is received.

* * * * *